United States Patent
See et al.

(10) Patent No.: US 8,059,748 B2
(45) Date of Patent: Nov. 15, 2011

(54) MULTI-MODE AND MULTI-BAND TRANSMITTERS FOR WIRELESS COMMUNICATION

(75) Inventors: Puay Hoe See, San Diego, CA (US); Gurkanwal Singh Sahota, San Diego, CA (US); Bo Sun, Carlsbad, CA (US); Gary John Ballantyne, Christchurch (NZ); William Ronald Panton, San Diego, CA (US); Zae Yong Choi, San Jose, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 975 days.

(21) Appl. No.: 11/857,929

(22) Filed: Sep. 19, 2007

(65) Prior Publication Data
US 2009/0074106 A1    Mar. 19, 2009

(51) Int. Cl.
*H04K 1/02* (2006.01)
*H04B 1/04* (2006.01)
(52) U.S. Cl. ..................... 375/296; 455/114.3
(58) Field of Classification Search .......... 375/260, 375/285, 295–298; 455/63.1, 114.2, 114.3
See application file for complete search history.

(56) References Cited

U.S. PATENT DOCUMENTS

| 6,529,716 B1 * | 3/2003 | Eidson et al. ............... 455/115.1 |
| 6,906,996 B2 | 6/2005 | Ballantyne |
| 7,180,384 B2 * | 2/2007 | Efstathiou et al. ............ 332/106 |
| 7,280,810 B2 * | 10/2007 | Feher ............................ 455/137 |
| 7,474,708 B1 * | 1/2009 | Khlat et al. .................... 375/296 |
| 7,599,448 B2 * | 10/2009 | Ahmed et al. ................. 375/300 |
| 7,742,748 B2 * | 6/2010 | Matero et al. ............... 455/114.3 |
| 2006/0038710 A1 * | 2/2006 | Staszewski et al. ........... 341/143 |
| 2007/0015472 A1 | 1/2007 | Murtojarvi et al. |
| 2008/0211576 A1 * | 9/2008 | Moffatt et al. ................ 330/149 |

(Continued)

FOREIGN PATENT DOCUMENTS
EP    1760877    3/2007

(Continued)

OTHER PUBLICATIONS

Robert O'Sullivan, UK Patent Application GB 2 407 929, "A Predistorter for a Polar Transmitter, Using Look-Up Tables and Interpolation, and Possessing a Simple Training Procedure", Nov. 5, 2005.*

(Continued)

*Primary Examiner* — Khanh C Tran
(74) *Attorney, Agent, or Firm* — Ramin Mobarhan

(57) ABSTRACT

Transmitters supporting multiple modulation modes and/or multiple frequency bands are described. A transmitter may perform large signal polar modulation, small signal polar modulation, and/or quadrature modulation, which may support different modulation schemes and systems. Circuit blocks may be shared by the different modulation modes to reduce cost and power. For example, a single modulator and a single power amplifier may be used for small signal polar modulation and quadrature modulation. The transmitter may apply pre-distortion to improve performance, to allow a power amplifier to support multiple frequency bands, to allow the power amplifier to operate at higher output power levels, etc. Envelope and phase distortions due to non-linearity of the power amplifier may be characterized for different input levels and different bands and stored at the transmitter. Thereafter, envelope and phase signals may be pre-distorted based on the stored characterizations to compensate for non-linearity of the power amplifier.

23 Claims, 8 Drawing Sheets

U.S. PATENT DOCUMENTS

| | | | |
|---|---|---|---|
| 2008/0318620 A1* | 12/2008 | van Waasen | 455/552.1 |
| 2009/0191825 A1* | 7/2009 | Georgantas et al. | 455/102 |
| 2010/0233977 A1* | 9/2010 | Minnis et al. | 455/127.1 |

FOREIGN PATENT DOCUMENTS

| | | |
|---|---|---|
| WO | 03101062 | 12/2003 |

OTHER PUBLICATIONS

International Search Report—PCT/US08/077121, International Search Authority—European Patent Office—Jan. 15, 2009.

Written Opinion—PCT/US08/077121, International Search Authority—European Patent Office—Jan. 15, 2009.

* cited by examiner

MULTI-MODE AND MULTI-BAND TRANSMITTERS FOR WIRELESS COMMUNICATION

BACKGROUND

I. Field

The present disclosure relates generally to electronic circuits, and more specifically to transmitters for wireless communication.

II. Background

A wireless device may support communication with multiple wireless communication systems. These systems may utilize different modulation schemes such as Gaussian minimum shift keying (GMSK), 8-ary phase shift keying (8-PSK), quadrature phase shift keying (QPSK), quadrature amplitude modulation (QAM), etc. These systems may also have different chip rates and/or operate on different frequency bands.

A transmitter within the wireless device may be designed to support multiple modulation schemes, multiple chip rates, and/or multiple frequency bands. To transmit data to a given system, the transmitter may first digitally process the data to generate symbols. The transmitter may then convert the symbols to analog signals, filter and amplify the analog signals, and modulate local oscillator (LO) signals with the amplified analog signals to generate a modulated signal. The transmitter may further filter and power amplify the modulated signal to generate a radio frequency (RF) output signal, which may then be transmitted via a wireless channel.

The transmitter may use various circuit blocks such as filters, amplifiers, mixers, etc. to generate an RF output signal for a given modulation scheme on a given frequency band. These circuit blocks may be designed to achieve good performance for the modulation scheme and the frequency band. To support multiple systems and/or multiple frequency bands, the circuit blocks may be replicated for each combination of modulation scheme and frequency band supported by the wireless device. This replication of circuit blocks may increase cost and power consumption for the wireless device.

There is therefore a need in the art for transmitters that can efficiently support different modulation schemes and/or frequency bands.

SUMMARY

Transmitters supporting multiple modulation modes and/or multiple frequency bands are described herein. In one design, a transmitter may support large signal polar modulation, small signal polar modulation, quadrature modulation, or a combination thereof. These different modulation modes have different characteristics and may be used for different modulation schemes, different systems, etc. Various circuit blocks may be shared by the different modulation modes in order to reduce cost and power. For example, a single modulator and a single power amplifier may be used for both small signal polar modulation and quadrature modulation. The transmitters are described in greater detail below.

In another design, a transmitter may selectively apply pre-distortion to improve performance, to allow a power amplifier to be used for multiple frequency bands, to allow the power amplifier to operate at higher output power levels, etc. Envelope and phase distortions due to non-linearity of the power amplifier may be characterized for different input levels and different frequency bands and stored at the transmitter. Thereafter, envelope and phase signals may be pre-distorted based on the stored characterizations of the power amplifier to compensate for non-linearity of the power amplifier.

Various aspects and features of the disclosure are described in further detail below.

DETAILED DESCRIPTION

Figure 1:
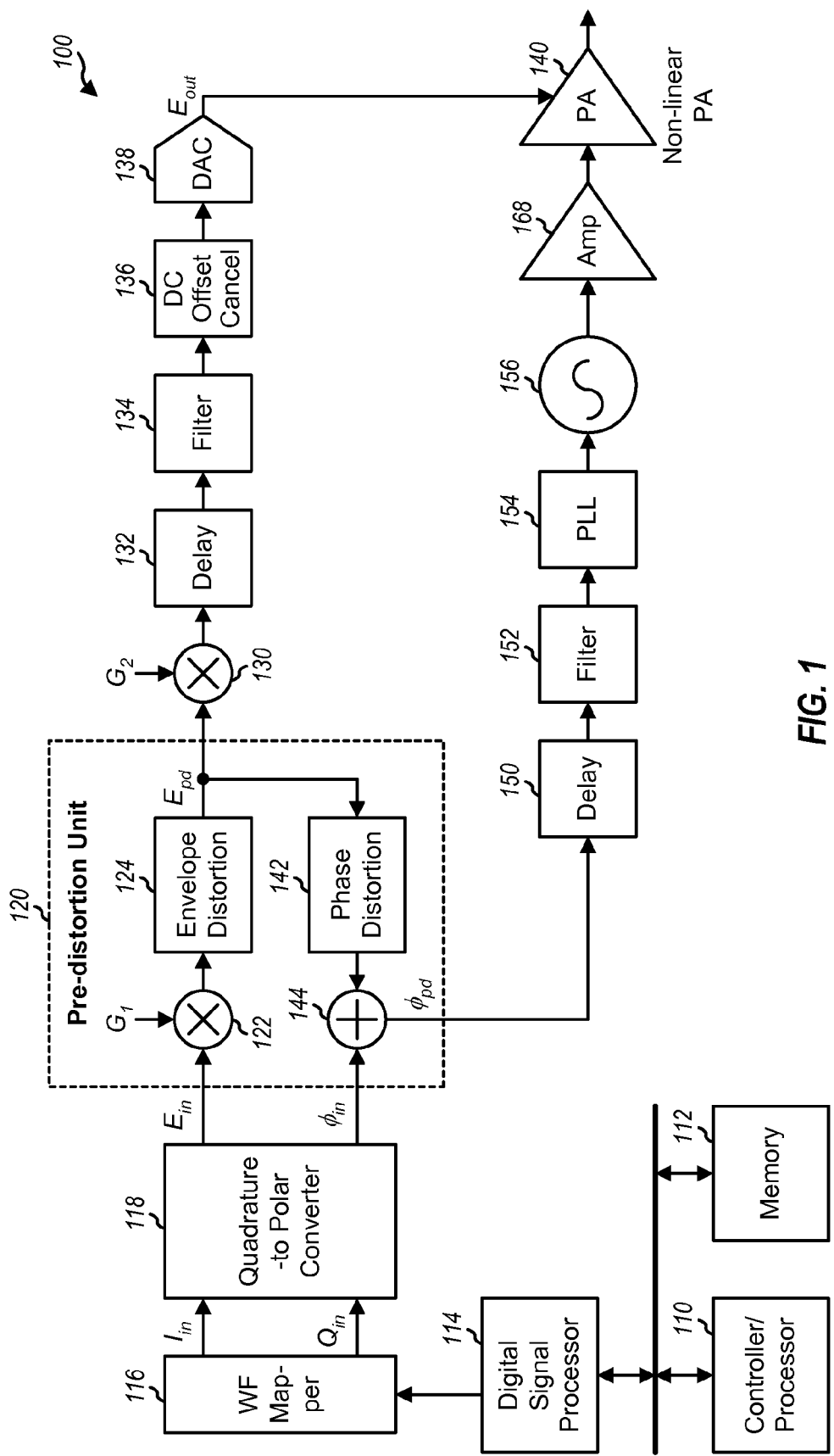
FIG. 1 shows a transmitter that supports large signal polar modulation.

The transmitters described herein may be used for various wireless communication systems such as Global System for Mobile Communication (GSM) systems, Code Division Multiple Access (CDMA) systems, Time Division Multiple Access (TDMA) systems, Frequency Division Multiple Access (FDMA) systems, Orthogonal FDMA (OFDMA) systems, Single-Carrier FDMA (SC-FDMA) systems, etc. These systems may implement various radio technologies. The terms "radio technology", "radio access technology", "air interface", and "communication protocol" are synonymous and are used interchangeably. A GSM system may utilize GMSK, which is an analog modulation scheme that modulates the phase of an LO signal with data in a continuous rather than abrupt manner. A GSM system that implements Enhanced Data for GSM Evolution (GSM/EDGE) may utilize 8-PSK. A CDMA system may implement a radio technology such as Wideband CDMA (W-CDMA) or cdma2000 and may utilize QPSK, QAM, etc. 8-PSK, QPSK and QAM are digital modulation schemes that map data to specific complex values for points in signal constellations. An OFDMA system may utilize orthogonal frequency division multiplexing (OFDM), and an SC-FDMA system may utilize single-carrier frequency division multiplexing (SC-FDM).

For clarity, several designs of transmitters are described below. Table 1 lists three transmitter configurations, the modulation mode or type for each transmitter configuration, and the type of power amplifier (PA) used for each modulation mode (or simply, mode). Table 1 also lists some modulation schemes and some systems/radio technologies that may be supported by each mode, in accordance with one design. In general, a transmitter may support any number of modes and any combination of modes. For example, a transmitter may support only modes 1 and 2, or only modes 2 and 3, or all three modes in Table 1. A transmitter may also support other modes not listed in Table 1. Furthermore, a transmitter may support any modulation scheme and any system/radio technology for each mode supported by the transmitter. Different systems/radio technologies may have different bandwidths or chip rates. Certain hardware limitations may limit which systems can be supported by each mode.

TABLE 1

| Mode Index | Modulation Mode/Type | Modulation Schemes | Systems/Radio Technologies | Power Amplifier |
|---|---|---|---|---|
| 1 | Large signal polar modulation | GMSK, 8-PSK | GSM, GSM/EDGE | Non-linear PA |
| 2 | Small signal polar modulation | GMSK, 8-PSK | GSM, GSM/EDGE | Linear PA |
| 3 | Quadrature modulation | GMSK, 8-PSK, QPSK, QAM | GSM, GSM/EDGE, W-CDMA | Linear PA |

As used herein, a linear PA is a PA having an output signal amplitude that is proportional to an input signal amplitude over one or more amplitude ranges of interest. A linear PA may attempt to preserve amplitude information in the input signal. A non-linear PA is any PA that is not a linear PA, as defined above. A non-linear PA may expect the input signal to have approximately constant amplitude.

In general, one or more LO signals may be modulated with data based on quadrature modulation, polar modulation, or some other type of modulation. For quadrature modulation, inphase (I) and quadrature (Q) LO signals may be modulated with I and Q modulating signals and combined to obtain a modulated signal, as follows:

$$S(t)=M_I(t)\cdot\cos(\omega t)+M_Q(t)\cdot\sin(\omega t), \quad \text{Eq (1)}$$

where $M_I(t)$ is the I modulating signal and $M_Q(t)$ is the Q modulating signal, $\cos(\omega t)$ is the I LO signal and $\sin(\omega t)$ is the Q LO signal, $S(t)$ is the modulated signal, and $\omega$ is the frequency of the LO signals (in radians/second) and t is time.

The I and Q LO signals are 90° out of phase. The modulated components $M_I(t)\cdot\cos(\omega t)$ and $M_Q(t)\cdot\sin(\omega t)$ are also in quadrature and, when combined, result in the modulated signal $S(t)$ being both amplitude and phase modulated.

For polar modulation, the modulated signal $S(t)$ may be expressed in a form to explicitly show the amplitude and phase modulation, as follows:

$$S(t) = E(t)\cdot\cos(\omega t + \phi(t)), \quad \text{Eq (2)}$$

$$\text{where } E(t) = \sqrt{M_I^2(t) + M_Q^2(t)}, \text{ and} \quad \text{Eq (3)}$$

$$\phi(t) = \arctan\left(\frac{M_Q(t)}{M_I(t)}\right). \quad \text{Eq (4)}$$

As shown in equations (2) through (4), for polar modulation, the I and Q modulating signals, $M_I(t)$ and $M_Q(t)$, may be converted to an envelope signal, $E(t)$, and a phase signal, $\phi(t)$. The phase signal may be used to modulate the phase of an LO signal, $\cos(\omega t)$, e.g., by adjusting the phase of a voltage controlled oscillator (VCO) used to generate the LO signal. The envelope signal may be used to modulate the amplitude of the LO signal.

For small signal polar modulation, amplitude modulation may be performed with the envelope signal prior to a PA to obtain the modulated signal. A linear PA may then be used to amplify the modulated signal and preserve the amplitude modulation. For large signal polar modulation, amplitude modulation may be performed by varying the gain of a PA with the envelope signal. A non-linear PA with higher power efficiency may be used for large signal polar modulation. For both small signal and large signal polar modulation, distortion generated by the PA may be compensated for by pre-distorting the envelope and phase signals, as described below.

FIG. 1 shows a block diagram of a design of a transmitter 100 that supports large signal polar modulation, or mode 1 in Table 1. A digital signal processor (DSP) 114 processes (e.g., encodes and interleaves) data to be transmitted and provides coded data. A waveform (WF) mapper 116 maps the coded data to complex-valued symbols based on GMSK, 8-PSK, QPSK, QAM, or some other modulation scheme. Waveform mapper 116 may further perform other processing (e.g., spreading, scrambling, multi-carrier modulation, single-carrier modulation, etc.) for CDMA, OFDM, SC-FDM, etc. Waveform mapper 116 provides the real part of each complex-valued symbol on an I data signal, $I_{in}$, and provides the imaginary part of each complex-valued symbol on a Q data signal, $Q_{in}$. A quadrature-to-polar converter 118 receives the I and Q data signals, converts the complex-valued symbols in these data streams from Cartesian to polar coordinates, and provides an envelope signal, $E_{in}$, and a phase signal, $\phi_{in}$. Converter 118 may implement equations (3) and (4) on each complex-valued symbol to obtain the magnitude and phase of that symbol.

In the envelope path, a multiplier 122 within a pre-distortion unit 120 multiplies the envelope signal with a gain $G_1$ and provides a scaled envelope signal. An envelope distortion unit 124 distorts the scaled envelope signal to compensate for non-linearity of a non-linear PA 140 and provides a pre-distorted envelope signal, $E_{pd}$. A multiplier 130 multiplies the pre-distorted envelope signal with a gain $G_2$ and provides an amplified envelope signal. Multipliers 122 and 130 may be used for power control to obtain a desired output power level. A delay unit 132 provides a programmable amount of delay, if needed, to time-align the envelope signal and the phase signal. A filter 134 may filter the delayed envelope signal with a lowpass, bandpass, or highpass filter response. A direct current (DC) offset cancellation unit 136 removes DC offset in the filtered envelope signal and provides a digital envelope signal. A digital-to-analog converter (DAC) 138 converts the digital envelope signal to analog and provides an output envelope signal, $E_{out}$. The gain of non-linear PA 140 is varied by the output envelope signal to achieve amplitude modulation.

In the phase path, a phase distortion unit 142 receives the pre-distorted envelope signal from unit 124 and provides a phase correction signal to compensate for phase error due to non-linearity of PA 140. The pre-distorted envelope (instead of the original envelope) may be used for phase distortion because it may be easier to characterize phase distortion versus PA output power (which corresponds to the pre-distorted envelope) than phase versus PA input power (which corresponds to the original envelope). A summer 144 sums the phase signal from converter 118 with the phase correction signal and provides a pre-distorted phase signal, $\phi_{pd}$. A delay unit 150 provides a programmable amount of delay, if needed, to time-align the envelope signal and the phase signal. A filter 152 may filter the delayed phase signal with a lowpass, bandpass, or highpass filter response. A phase locked loop (PLL) 154 receives the filtered phase signal and provides a control signal for a VCO 156. VCO 156 generates a phase modulated LO signal having a phase that is varied by the control signal from PLL 154.

A driver amplifier (Amp) 168 amplifies the phase modulated LO signal from VCO 156 and provides a phase modulated signal. PA 140 amplifies the phase modulated signal based on the output envelope signal and provides an RF output signal that is both phase and amplitude modulated, e.g., as shown in equation (2). PA 140 may be implemented with a class D amplifier having good power efficiency or with some other type of amplifier.

Figure 2:
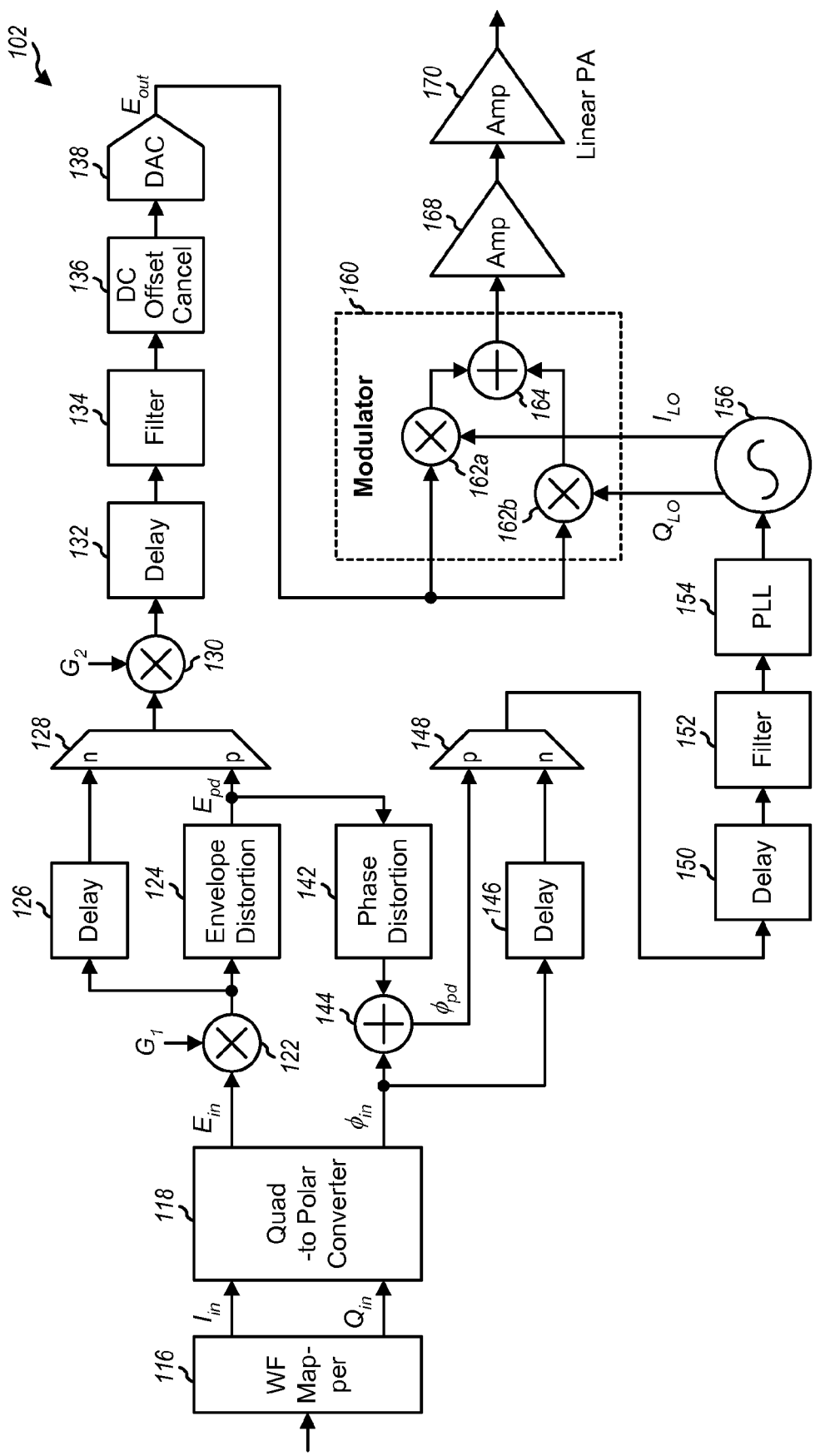
FIG. 2 shows a transmitter that supports small signal polar modulation.

A controller/processor 110 controls the operation of DSP 114 and other circuit blocks within transmitter 100. A memory 112 stores data and program codes for controller/processor 110 and/or other circuit blocks. Memory 112 may be implemented external to controller/processor 110 (as shown in FIG. 2) or internal to the controller/processor.

In the design shown in FIG. 1, "large signal" polar modulation is achieved by performing amplitude modulation on a relatively large signal at PA 140. The amplitude modulation by non-linear PA 140 may result in AM-AM distortion and AM-PM distortion, where AM stands for amplitude modulation and PM stands for phase modulation. AM-AM distortion is distortion in the amplitude of the RF output signal due to a non-linear gain function of PA 140. Envelope distortion unit 124 may compensate for the AM-AM distortion by applying an inverse gain function so that the overall gain function is linear. AM-PM distortion is distortion in the phase of the RF output signal due to non-linearity of PA 140. Phase distortion unit 142 may compensate for the AM-PM distortion by applying a phase correction that is opposite of the phase error due to the AM-AM distortion. The AM-AM distortion and the AM-PM distortion for PA 140 may be characterized. Unit 124 may store a table of pre-distorted envelope values that can compensate for the AM-AM distortion. Unit 142 may store a table of phase correction values that can compensate for the AM-PM distortion. Pre-distortion is described in greater detail below.

FIG. 1 shows a specific design of a transmitter that supports large signal polar modulation. The transmitter may also be implemented with fewer, additional and/or different circuit blocks than those shown in FIG. 1. For example, filters 134 and 152 may be omitted. The circuit blocks may also be arranged differently than shown in FIG. 1.

A transmitter for large signal polar modulation may also be implemented in other manners with other designs. In another design, a delta-sigma ($\Sigma\Delta$) modulator may convert the envelope signal to an intermediate signal having fewer bits but at a higher sample rate. The intermediate signal may be combined (e.g., multiplied or exclusive-ORed) with the phase modulated signal, and the resultant signal may be amplified by PA 140 to generate the RF output signal.

FIG. 2 shows a block diagram of a design of a transmitter 102 that supports small signal polar modulation, or mode 2 in Table 1. Transmitter 102 utilizes a linear PA 170 and may selectively apply pre-distortion to compensate for any non-linearity of PA 170. Units 110 through 114 are not shown in FIG. 2 for clarity. Waveform mapper 116 and quadrature-to-polar converter 118 process data to be transmitted, as described above for FIG. 1, and provide the envelope signal, $E_{in}$, and the phase signal, $\phi_{in}$.

In the envelope path, the envelope signal is multiplied with gain $G_1$ by multiplier 122 and pre-distorted by envelope distortion unit 124 to obtain the pre-distorted envelope signal, $E_{pd}$, which is provided to a first ('p') input of a multiplexer 128. A delay unit 126 delays the scaled envelope signal from multiplier 122 to match the delay of unit 124 and provides a delayed envelope signal to a second ('n') input of multiplexer 128. In the description herein, the inputs of multiplexers are labeled with 'p' for pre-distortion and 'n' for no pre-distortion. The multiplexer inputs may also be labeled with '1', '2' and/or '3' for modes 1, 2 and/or 3, respectively, when applicable. Multiplexer 128 provides the pre-distorted envelope signal from unit 124 when pre-distortion is applied and provides the delayed envelope signal from unit 126 when pre-distortion is not applied. Multiplier 130 through DAC 138 operate on the output signal from multiplier 128, as described above for FIG. 1, and provide the output envelope signal, $E_{out}$.

In the phase path, phase distortion unit 142 receives the pre-distorted envelope signal from unit 124 and provides the phase correction signal. Summer 144 sums the phase signal, $\phi_{in}$, from converter 118 with the phase correction signal and provides the pre-distorted phase signal, $\phi_{pd}$, to a first ('p') input of a multiplexer 148. A delay unit 146 delays the phase signal from converter 118 and provides the delayed phase signal to a second ('n') input of multiplexer 148. Multiplexer 148 provides the pre-distorted phase signal from unit 142 when pre-distortion is applied and provides the delayed phase signal from unit 146 when pre-distortion is not applied. Delay unit 150 and filter 152 then operate on the output signal from multiplexer 148, as described above for FIG. 1, and provide the filtered phase signal to PLL 154. PLL 154 receives the filtered phase signal and provides the control signal for VCO 156. VCO 156 generates I and Q LO signals, $I_{LO}$ and $Q_{LO}$, which have their phases varied by the control signal to achieve phase modulation.

A modulator 160 performs amplitude modulation on the phase modulated I and Q LO signals from VCO 160 with the output envelope signal from DAC 138. Within modulator 160, a mixer 162a modulates the I LO signal with the output envelope signal, and a mixer 162b modulates the Q LO signal with the output envelope signal. A summer 164 sums the outputs of mixers 162a and 162b and provides a modulated signal that is both amplitude and phase modulated. Driver amplifier 168 amplifies the modulated signal from modulator 160 and provides an amplified modulated signal. PA 170 further amplifies the signal from amplifier 168 and provides the RF output signal. PA 170 may be implemented with a linear PA having relatively good linearity or with some other type of amplifier.

In the design shown in FIG. 2, "small signal" polar modulation is achieved by performing amplitude modulation on relatively small signals with modulator 160 prior to PA 170. Since the output envelope signal is provided to both mixers 162a and 162b, modulator 160 behaves as a multiplier. Modulator 160 may thus be replaced with a multiplier or some other circuit that can perform multiplication. The amount of distortion on the RF output signal may be relatively small since amplitude modulation is performed on relatively small signals and linear PA 170 is used to generate the RF output signal. In this case, envelope and phase pre-distortion may be omitted. Alternatively, envelope and/or phase pre-distortion may be applied to improve performance.

FIG. 2 shows a specific design of a transmitter that supports small signal polar modulation. The transmitter may also be implemented with fewer, additional and/or different circuit blocks than those shown in FIG. 2. The circuit blocks may also be arranged differently than shown in FIG. 2. A transmitter for small signal polar modulation may also be implemented in other manners with other designs.

Figure 3:
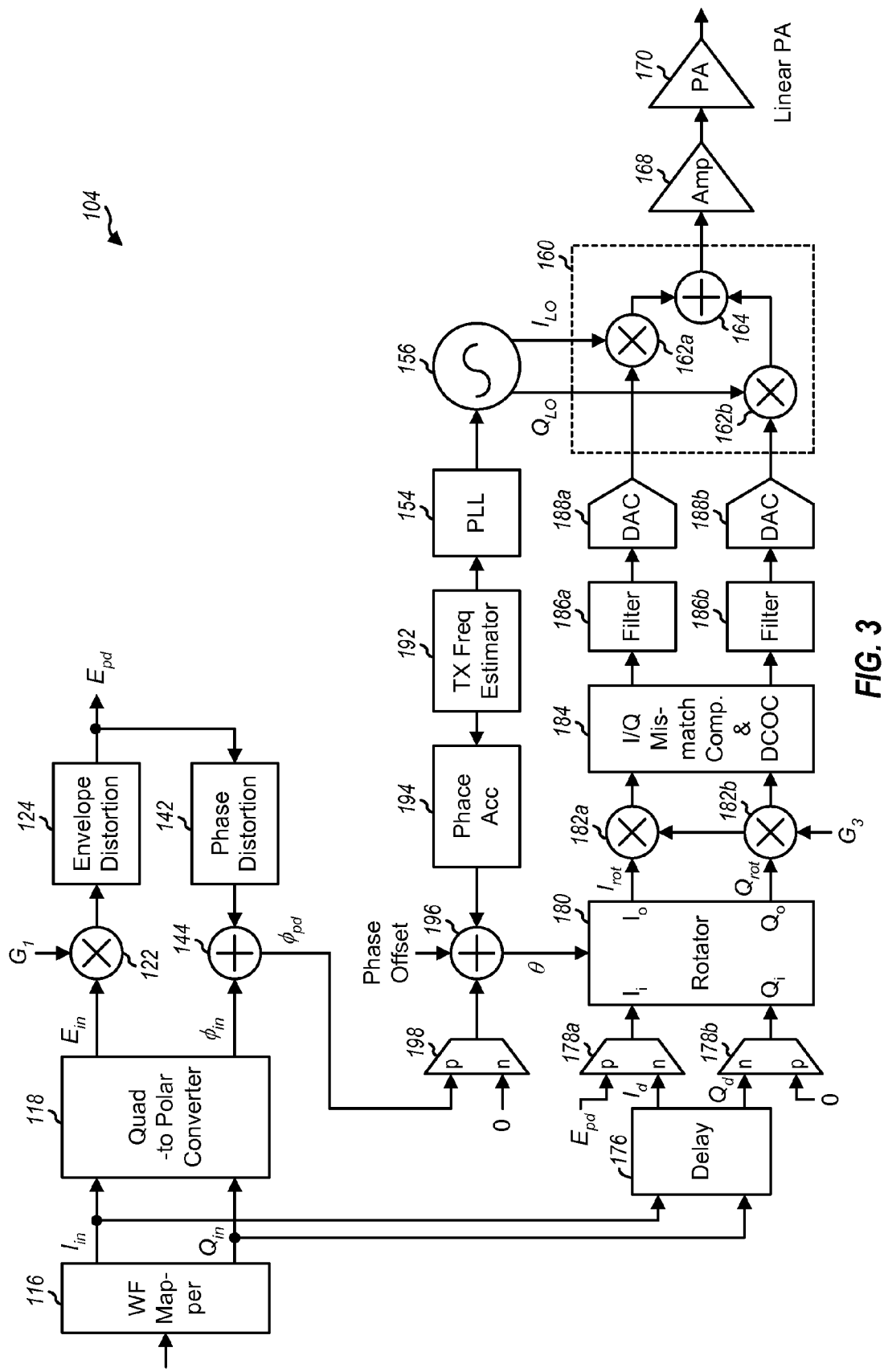
FIG. 3 shows a transmitter that supports quadrature modulation.

FIG. 3 shows a block diagram of a design of a transmitter 104 that supports quadrature modulation, or mode 3 in Table 1. Transmitter 104 may selectively apply pre-distortion to compensate for any non-linearity of PA 170. Units 110 through 114 are not shown in FIG. 3 for clarity. Waveform mapper 116 processes data to be transmitted and provides the I and Q data signals, $I_{in}$ and $Q_{in}$. Quadrature-to-polar converter 118, multiplier 122, envelope distortion unit 124, phase distortion unit 142, and summer 144 operate on the I and Q data signals, as described above for FIG. 1, and provide the pre-distorted envelope signal, $E_{pd}$, and the pre-distorted phase signal, $\phi_{pd}$.

A delay unit 176 receives the I and Q data signals, delays these signals to match the delays of units 118 through 144, and provides delayed I and Q signals, $I_d$ and $Q_d$. Multiplexers 178a and 178b receive the delayed I and Q signals at a first ('n') input and provide these signals to I and Q inputs of a digital rotator 180 when pre-distortion is not applied. Multiplexers 178a and 178b also receive the pre-distorted envelope signal and a zero signal at a second ('p') input and provide these signals to the I and Q inputs of rotator 180 when pre-distortion is applied. Rotator 180 rotates the signals at its I and Q inputs based on a phase correction signal, θ, and provides I and Q rotated signals, $I_{rot}$ and $Q_{rot}$. When pre-distortion is not applied, rotator 180 may rotate the delayed I and Q signals to correct for frequency error and phase offset in the LO signals from VCO 156. When pre-distortion is applied, rotator 180 may rotate the pre-distorted envelope signal, $E_{pd}$, to correct for phase distortion due to PA 170 as well as frequency error and phase offset in the LO signals.

Multipliers 182a and 182b multiply the I and Q rotated signals from rotator 180 with a gain $G_3$ and provide scaled I and Q signals, respectively. A unit 184 processes the scaled I and Q signals to compensate for I/Q mismatch, for DC offset cancellation (DCOC), etc. I/Q mismatch may result from different gains for the I and Q paths, the I and Q paths not being 90° out of phase, etc. Filters 186a and 186b filter the I and Q outputs of unit 184 and provide filtered I and Q signals, respectively. DACs 190a and 190b convert the filtered I and Q signals to analog and provide I and Q modulating signals, respectively.

Modulator 160 performs quadrature modulation on the I and Q LO signals from VCO 156 with the I and Q modulating signals from DACs 190a and 190b. Within modulator 160, mixer 162a modulates the I LO signal with the I modulating signal, and mixer 162b modulates the Q LO signal with the Q modulating signal. Summer 164 sums the outputs of mixers 162a and 162b and provides a modulated signal. Driver amplifier 168 amplifies the modulated signal and provides an amplified modulated signal. PA 170 further amplifies the signal from amplifier 168 and provides the RF output signal.

A transmit (TX) frequency estimator 192 estimates frequency error in the LO signals, provides a coarse frequency error to PLL 154, and provides a fine frequency error to a phase accumulator (Acc) 194. PLL 154 generates the control signal for VCO 156 such that the coarse frequency error is corrected. Accumulator 194 accumulates the fine frequency error and provides a phase error. A multiplexer 198 receives and provides the pre-distorted phase signal, $\phi_{pd}$, when pre-distortion is applied and provides a zero signal when pre-distortion is not applied. A summer 196 sums the phase error from accumulator 194, the output of multiplexer 198, and a phase offset and provides the phase correction signal, θ, to rotator 180.

FIG. 3 shows a specific design of a transmitter that supports quadrature modulation with and without pre-distortion. The transmitter may also be implemented with fewer, additional and/or different circuit blocks than those shown in FIG. 3. The circuit blocks may also be arranged differently than shown in FIG. 3. A transmitter for quadrature modulation may also be implemented in other manners with other designs. For example, the pre-distortion circuit blocks may be omitted, and the I and Q data signals may be provided directly to rotator 180.

As noted above, a transmitter may support any combination of the modes shown in Table 1 and/or other modes. A transmitter may support multiple modes by sharing circuit blocks, where possible, in order to reduce overall complexity.

Figure 4:
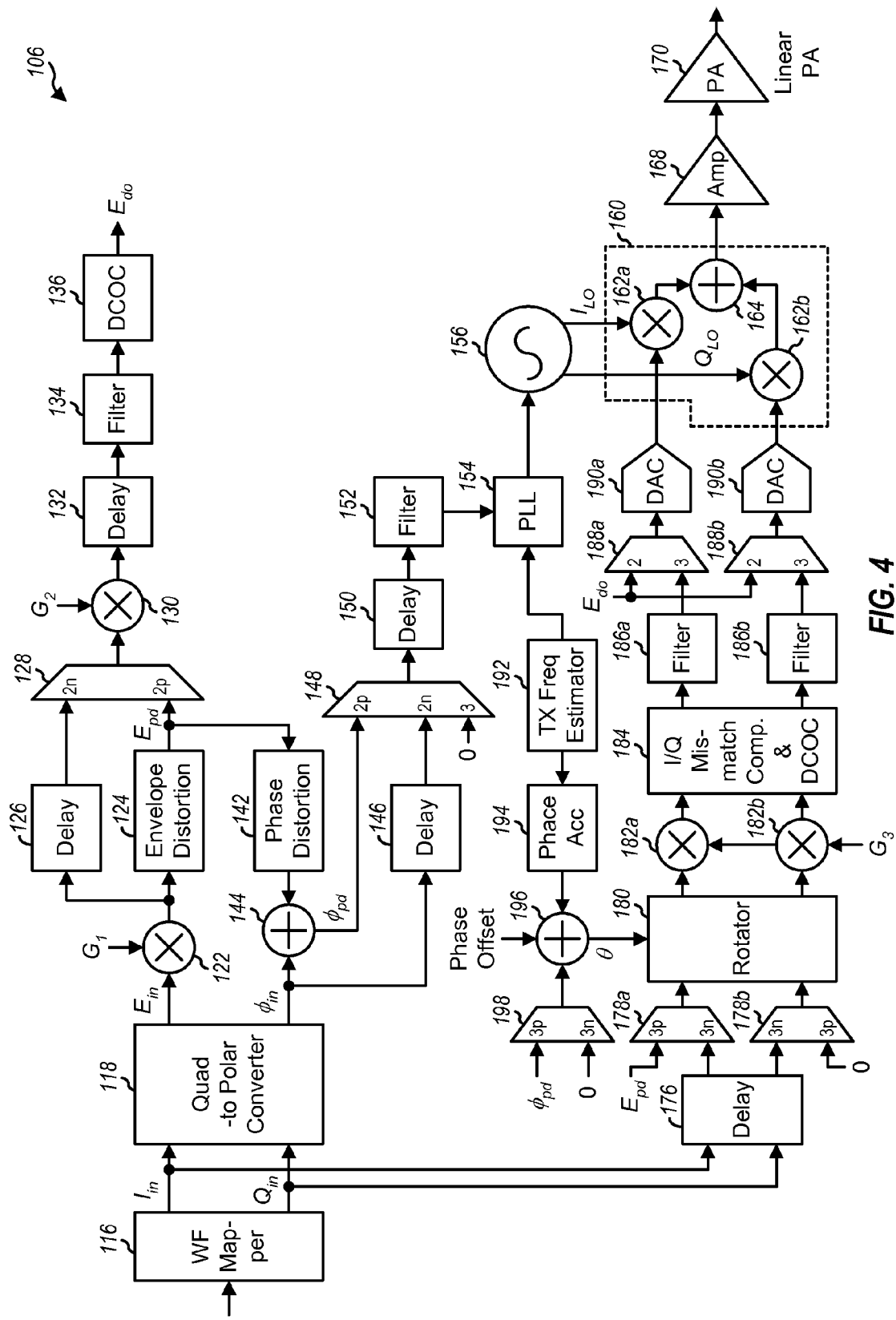
FIG. 4 shows a transmitter that supports small signal polar modulation and quadrature modulation, each with or without pre-distortion.

FIG. 4 shows a block diagram of a design of a transmitter 106 that supports small signal polar modulation and quadrature modulation, or modes 2 and 3 in Table 1. Transmitter 106 also supports pre-distortion or no pre-distortion for each mode. Units 110 through 114 are not shown in FIG. 4 for clarity. Waveform mapper 116 processes data and provides the I and Q data signals, $I_{in}$ and $Q_{in}$. Quadrature-to-polar converter 118 converts the I and Q data signals from Cartesian to polar coordinates and provides the envelope signal, $E_{in}$, and the phase signal, $\phi_{in}$.

In the envelope path, the envelope signal is multiplied with gain $G_1$ by multiplier 122, pre-distorted by envelope distortion unit 124, and provided to the first ('2p') input of multiplexer 128. The scaled envelope signal from multiplier 122 is also delayed by unit 126 and provided to the second ('2n') input of multiplexer 128. Multiplexer 128 provides the pre-distorted envelope signal from unit 124 when pre-distortion is applied and provides the delayed envelope signal from unit 126 when pre-distortion is not applied. Multiplier 130 through DCOC unit 136 operate on the output signal from multiplexer 128, as described above for FIG. 1, and provide a digital envelope signal, $E_{do}$.

In the phase path, phase distortion unit 142 receives the pre-distorted envelope signal from unit 124 and provides the phase correction signal. Summer 144 sums the phase signal from converter 118 with the phase correction signal and provides the pre-distorted phase signal, $\phi_{pd}$, to the first ('2p') input of multiplexer 148. Delay unit 146 delays the phase signal from converter 118 and provides the delayed phase signal to the second ('2n') input of multiplexer 148. A zero signal is provided to a third ('3') input of multiplexer 148. Multiplexer 148 provides the pre-distorted phase signal from unit 142 when polar modulation with pre-distortion is selected, provides the delayed phase signal from unit 146 when polar modulation without pre-distortion is selected, and provides the zero signal when quadrature modulation is selected. Delay unit 150 and filter 152 operate on the output signal from multiplexer 148, as described above for FIG. 1, and provide the filtered phase signal to PLL 154.

For quadrature modulation, delay unit 176 through filters 186a and 186b are coupled as described above for FIG. 3. Multiplexers 188a and 188b receive the digital envelope signal, $E_{do}$, from DCOC unit 136 at their first ('2') input and provide this signal to DACs 190a and 190b, respectively, when polar modulation is selected. Multiplexers 188a and 188b also receive the filtered I and Q signals from filters 186a and 186b, respectively, at their second ('3') input and provide these signals to DACs 190a and 190b, respectively, when quadrature modulation is selected.

DACs 190a and 190b provide the output envelope signal to mixers 162a and 162b, respectively, when small signal polar modulation is selected. DACs 190a and 190b provide the I and Q modulating signals to mixers 162a and 162b, respectively, when quadrature modulation is selected. Mixer 162a modulates the I LO signal, $I_{LO}$, with the I modulating signal or the envelope signal from DAC 190a. Mixer 162b modulates the Q LO signal, $Q_{LO}$, with the Q modulating signal or the envelope signal from DAC 190b. Summer 164 sums the outputs of mixers 162a and 162b and provides the modulated signal for small signal polar modulation and quadrature modulation.

Driver amplifier 168 amplifies the modulated signal from modulator 160 and provides an amplified signal to linear PA 170. PA 170 amplifies the signal from amplifier 168 with a fixed or selectable gain and provides the RF output signal for small signal polar modulation and quadrature modulation.

VCO 156 generates the I and Q LO signals for both modes 2 and 3. For small signal polar modulation, VCO 156 provides the I and Q LO signals with phase modulation to mixers 162a and 162b, respectively. For quadrature modulation, VCO 156 provides the I and Q LO signals without phase modulation to mixers 162a and 162b, respectively.

As shown in FIG. 4, transmitter 106 efficiently supports modes 2 and 3 in Table 1 using shared circuit blocks (e.g., one linear PA 170) and further supports pre-distortion or no pre-distortion for each mode. For polar modulation, quadrature-to-polar converter 118 is used to convert the I and Q data signals to the envelope and phase signals. Pre-distortion may be applied or omitted by controlling multiplexers 128 and 148.

Figure 5:
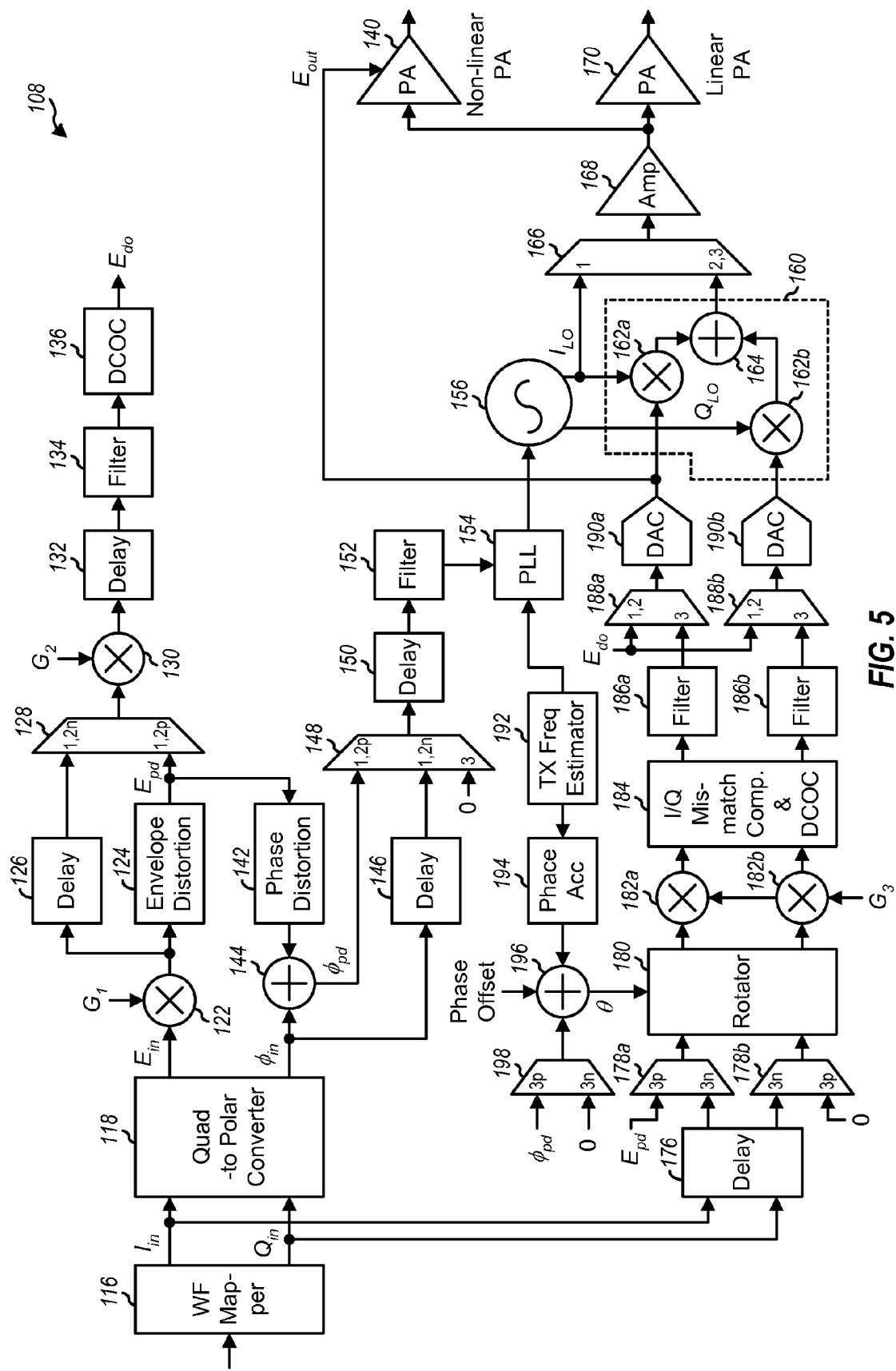
FIG. 5 shows a transmitter that supports large signal polar modulation, small signal polar modulation, and quadrature modulation, each with or without pre-distortion.

FIG. 5 shows a block diagram of a design of a transmitter 108 that supports large signal polar modulation, small signal polar modulation, and quadrature modulation, or all three modes in Table 1. Transmitter 108 also supports pre-distortion or no pre-distortion for each mode. Units 110 through 114 are not shown in FIG. 4 for clarity. Units 116 through 190 operate as described above for FIG. 4, with the differences noted below.

In the envelope path, multiplexer 128 receives the pre-distorted envelope signal from envelope distortion unit 124 at the first ('1,2p') input and receives the delayed envelope signal from unit 126 at the second ('1,2n') input. In the phase path, multiplexer 148 receives the pre-distorted phase signal, $\phi_{pd}$, from summer 144 at the first ('1,2p') input, the delayed phase signal from delay unit 146 at the second ('1,2n') input, and a zero signal at a third ('3') input.

Multiplexers 188a and 188b receive the digital envelope signal, $E_{do}$, from DCOC unit 136 at their first ('1,2') input and provide this signal to DACs 190a and 190b, respectively, when polar modulation is selected. DAC 190a provides the output envelope signal, $E_{out}$, to non-linear PA 140 when large signal polar modulation is selected. Modulator 160 operates as described above for FIG. 4.

A multiplexer 166 receives the I LO signal at a first ('1') input and provides this signal to driver amplifier 168 when large signal polar modulation is selected. Multiplexer 166 also receives the modulated signal at a second ('2,3') input and provides this signal to driver amplifier 168 when small signal polar modulation or quadrature modulation is selected. Amplifier 168 amplifies the output signal from multiplexer 166 and provides an amplified signal to both non-linear PA 140 and linear PA 170. Non-linear PA 140 amplifies the signal from amplifier 168 with a variable gain determined by the output envelope signal and provides the RF output signal for large signal polar modulation. Linear PA 170 amplifies the signal from amplifier 168 and provides the RF output signal for small signal polar modulation and quadrature modulation.

VCO 156 generates the I and Q LO signals for all three modes. For large signal polar modulation, VCO 156 provides the I LO signal with phase modulation to the first ('1') input of multiplexer 166. VCO 156 also provides the I and Q LO signals for small signal polar modulation and quadrature modulation, as described above for FIG. 4.

As shown in FIG. 5, transmitter 108 efficiently supports all three modes in Table 1 using shared circuit blocks and further supports pre-distortion or no pre-distortion for each mode. For polar modulation, quadrature-to-polar converter 118 is used to convert the I and Q data signals to the envelope and phase signals. Pre-distortion may be applied or omitted by controlling multiplexers 128 and 148.

For quadrature modulation, pre-distortion may be applied by re-using quadrature-to-polar converter 118 and pre-distortion unit 120 to generate the pre-distorted envelope and phase signals, which may be converted back to quadrature by rotator 180. Pre-distortion may be omitted by passing the I and Q data signals from waveform mapper 116 via delay unit 176 and multiplexers 178 to rotator 180.

In FIGS. 2, 4 and 5, polar modulation may be performed with either mixer 162a or 162b, or with both mixers 162a and 162b. One switch may be inserted between mixer 162a and summer 164, and another switch may be inserted between mixer 162b and summer 164. Each switch may be closed to allow the associated mixer to be used for polar modulation.

FIGS. 1 through 5 show transmitters that implement a direct-conversion architecture, which performs modulation directly at RF to generate a modulated signal at a desired RF frequency. A transmitter may also implement a super-heterodyne transmitter, which performs modulation at an intermediate frequency (IF) and then frequency upconverts the modulated signal to RF. In general, a transmitter may perform signal conditioning and modulation using one or more stages of amplifier, filter, mixer, etc.

The circuit blocks in FIGS. 1 through 5 may be implemented in various manners. Example designs for some circuit blocks are described below.

Quadrature-to-polar converter 118 may be implemented in various manners. In one design, quadrature-to-polar converter 118 is implemented with a look-up table that receives I and Q values in each symbol period and provides the envelope and phase for these I and Q values. The look-up table may be implemented with a sufficient number of bits to achieve a desired resolution for the input I and Q values and the output envelope and phase. In another design, quadrature-to-polar converter 118 is implemented with a Coordinate Rotational Digital Computer (CORDIC) processor. The CORDIC processor implements an iterative algorithm that allows for calculation of trigonometric functions such as envelope and phase using simple shift, add, and subtract operations.

Rotator 180 may be implemented with a look-up table or with the same CORDIC processor used for quadrature-to-polar converter 118. The CORDIC processor may be operated in the reverse manner to perform rotation on the envelope signal with the phase correction signal to obtain I and Q signals.

Pre-distortion may be performed to compensate for any non-linearity of a PA and/or other circuit blocks in the transmit path. Pre-distortion may also be used to extend an output power range of a linear PA. Operating the linear PA near the saturated region may improve power efficiency. Pre-distortion may also be used to support operation of a linear or non-linear PA on multiple frequency bands, which may reduce the number of PAs needed for all supported frequency bands.

For pre-distortion, the envelope and phase of a given PA may be characterized for different input envelope levels to obtain a gain function and a phase error function for that PA. A gain correction function may be defined based on the gain function such that the cascade of these two functions is a linear overall gain function. Similarly, a phase correction function may be defined based on the phase error function such that the combination of these two functions provides no phase error. The characterization of the PA may be performed via calibration during manufacturing, testing, etc.

Figure 6A:
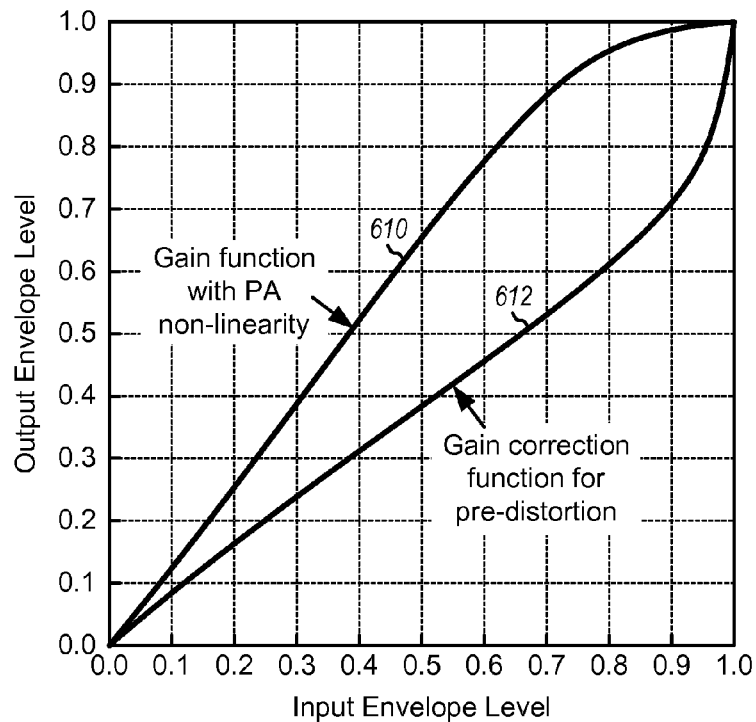
FIG. 6A shows a gain function for a power amplifier.

FIG. 6A shows a plot 610 of an example gain function for a PA. This PA has a relatively linear gain function for small input envelope levels and compresses for large input envelope levels. A gain correction function for this PA is shown by a plot 612. This gain correction function provides more gain at larger input envelope levels to compensate for signal compression in the original gain function. The net result is a relatively linear overall gain function across an entire range of input envelope levels.

Figure 6B:
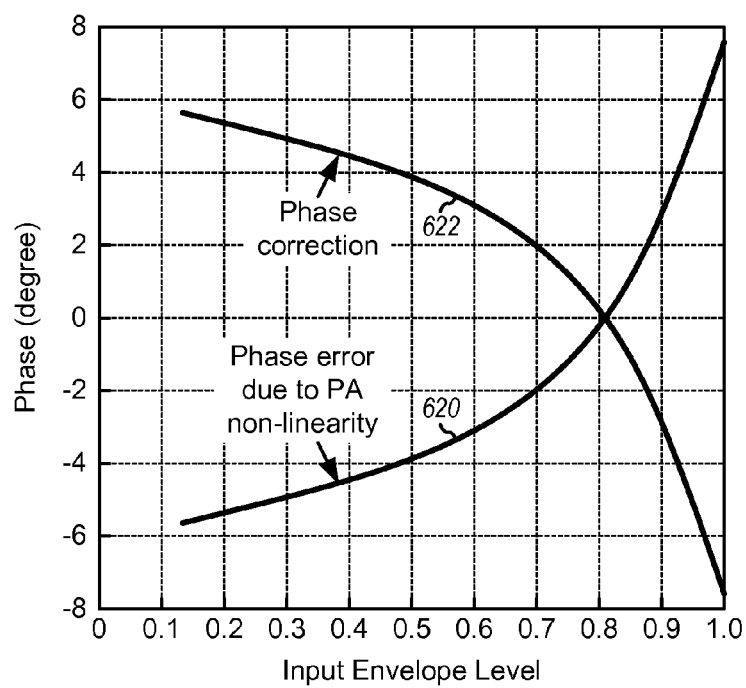
FIG. 6B shows a phase error function for a power amplifier.

FIG. 6B shows a plot 620 of an example phase error function for a PA. This PA has phase error of approximately −6° for small input envelope levels and phase error of up to +8° for large input envelope levels. In general, the phase error function may have any shape and may or may not be monotonic. A phase correction function for this PA is shown by a plot 622. This phase correction function provides phase correction of the same magnitude but opposite polarity for each input envelope level. The net result is approximately zero phase error across the entire range of input envelope levels.

In one design, the gain correction function and the phase correction function are sampled at a sufficient number of input envelope levels and stored in envelope and phase look-up tables. Thereafter, the envelope signal level is used to index the envelope look-up table to obtain a corresponding pre-distorted envelope level. The pre-distorted envelope level is used to index the phase look-up table to obtain a corresponding phase correction value.

In another design, piece-wise linear approximations of the gain correction function and the phase correction function are stored in the envelope and phase look-up tables. This design may improve pre-distortion accuracy while using less memory storage.

Figure 6C:
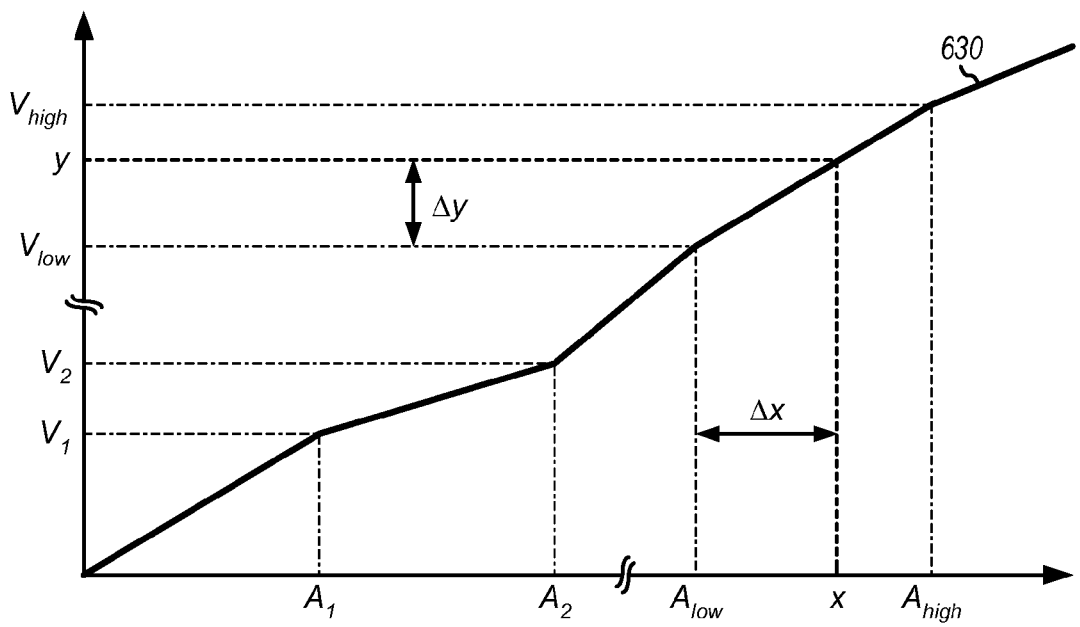
FIG. 6C shows piece-wise linear approximation of a correction function.

FIG. 6C shows a plot 630 of piece-wise linear approximation of a gain or phase correction function. The range of input envelope levels (or simply, input levels) may be partitioned into multiple subranges, with each subrange being defined by a low end input level and a high end input level. The subranges may have equal size of S, which may be any value. The correction function may be sampled at the ends of each subrange and stored in a look-up table. For example, values $V_1$, $V_2$, etc., may be stored for the low ends of subranges 1, 2, etc., respectively. The correction function is approximated by a linear function in each subrange, with the linear function being defined by the stored values for the low and high ends of the subrange. For example, the linear function for subrange 1 is defined by value $V_1$ at the low end and value $V_2$ at the high end.

To determine a value y of the correction function at a particular input level x, the subrange containing input level x is first determined. The stored value $V_{low}$ for the low end $A_{low}$ and the stored value $V_{high}$ for the high end $A_{high}$ of this subrange are then retrieved from the look-up table. Linear interpolation may be performed for the portion of the input level that is within the subrange, which is $\Delta x = x - A_{low}$, to obtain an interpolated value $\Delta y$. The interpolated value $\Delta y$ may be summed with the low end value $V_{low}$ to obtain the output value y. The linear interpolation may be given as:

$$\Delta y = \Delta x \cdot (V_{high} - V_{low})/S, \text{ and} \quad \text{Eq (5a)}$$

$$y = \Delta y + V_{low}. \quad \text{Eq (5b)}$$

Figure 7:
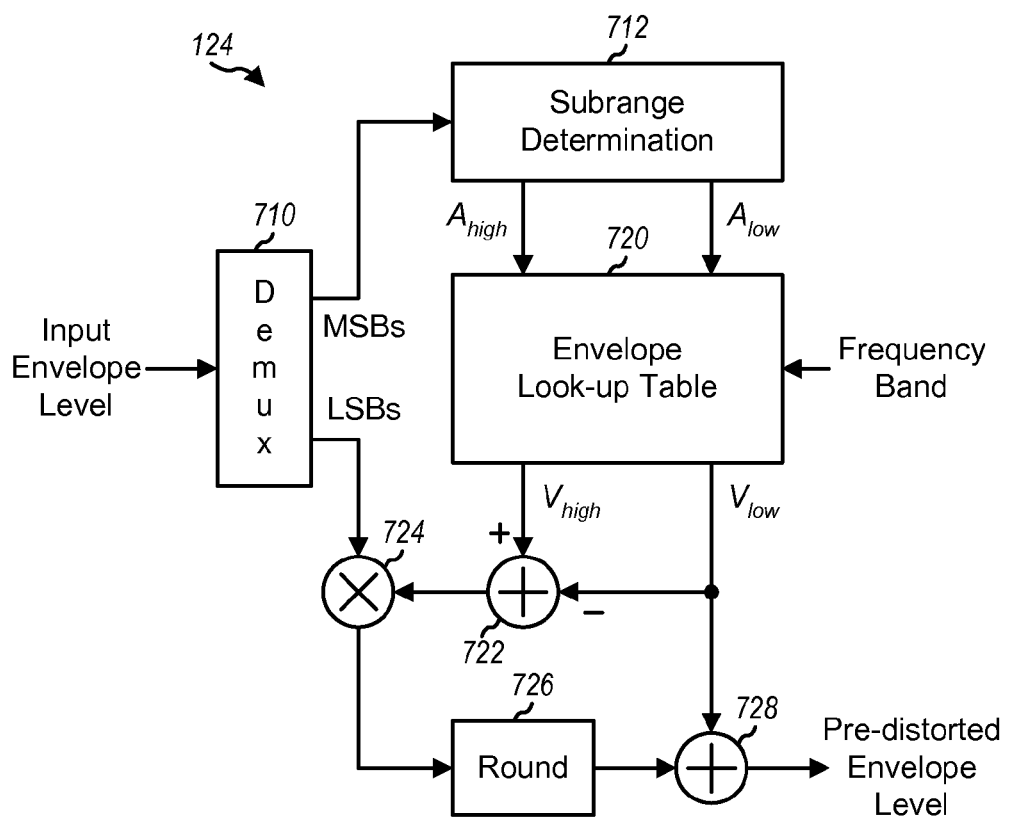
FIG. 7 shows a block diagram of an envelope distortion unit.

FIG. 7 shows a block diagram of a design of envelope distortion unit 124. A demultiplexer (Demux) 710 receives an input envelope level, provides L most significant bits (MSBs) to a subrange determination unit 712, and provides the remaining least significant bits (LSBs) to a multiplier 724. The subranges may be defined such that the L MSBs form an index for the subrange containing the input envelope level and the LSBs correspond to $\Delta x$ in equation set (5). Unit 712 determines the subrange containing the input level based on the L MSBs and provides the low end level $A_{low}$ and the high end level $A_{high}$ or an index of this subrange. A look-up table 720 stores a piece-wise linear approximation of a gain correction function. Table 720 receives the low and high ends, $A_{low}$ and $A_{high}$, or the subrange index and provides the stored values, $V_{low}$ and $V_{high}$, for the two ends of this subrange. A summer 722 subtracts $V_{low}$ from $V_{high}$ and provides the slope of the line for the subrange. Multiplier 724 multiplies the slope from summer 722 with the LSBs from demultiplexer 710 and provides the interpolated value, which corresponds to $\Delta y$ in equation set (5). The interpolated value may be rounded by unit 726 and summed with the stored value $V_{low}$ for the low end by a summer 728 to obtain a pre-distorted envelope level.

FIG. 7 shows a specific design of envelope distortion unit 124. Phase distortion unit 142 may be implemented in similar manner using piece-wise linear approximation of a phase correction function. Pre-distortion may also be performed in other manners, e.g., using linear or piece-wise linear interpolation, polynomial curve fitting, etc. In another design, pre-distortion may be performed for only some input envelope levels instead of the entire range of levels. For example, pre-distortion may be performed for large input levels, e.g., the top 4 or 6 decibels (dB) where non-linearity is typically greater. In another design, pre-distortion may be performed for only envelope but not phase, or for only phase but not envelope.

The envelope signal, $E_{in}$, may be scaled by multiplier 122 with gain $G_1$ such that the scaled envelope level provided to envelope distortion unit 124 closely matches the envelope level provided to PA 140 or 170. This may then ensure that the proper pre-distortion is applied to envelope and phase.

A transmitter may operate on one or more frequency bands. For example, a transmitter may support any one or any combination of the frequency bands shown in Table 2, which are commonly used for GSM, W-CDMA, and cdma2000.

TABLE 2

| Frequency Band | Frequency Band | Uplink (MHz) | Downlink (MHz) | Common Name |
|---|---|---|---|---|
|  | UMTS Band I | 1920-1980 | 2110-2170 | IMT-2000 |
| GSM 1900 | UMTS Band II | 1850-1910 | 1930-1990 | PCS |
| GSM 1800 | UMTS Band III | 1710-1785 | 1805-1880 | DCS |
|  | UMTS Band IV | 1710-1770 | 2110-2170 |  |
| GSM 850 | UMTS Band V | 824-849 | 869-894 | Cellular |
| W-CDMA 800 | UMTS Band VI | 830-840 | 875-885 |  |
| GSM 900 |  | 890-915 | 935-960 |  |

A PA may have different gain functions and/or different phase error functions for different frequency bands. For example, the shape of the gain or phase error function may be different for different frequency bands. The gain and/or phase error for each frequency band of interest may be characterized and used for pre-distortion for that frequency band.

A PA may also have different gain functions and/or different phase error functions for different radio technologies, e.g., GSM, EDGE, W-CDMA, cdma2000, etc. Different radio technologies may have different expected transmit power levels. The gain and/or phase error for each radio technology of interest may be characterized and used for pre-distortion for that radio technology.

In general, a PA may support multiple transmitter settings, where each transmitter setting may correspond to a different frequency band and/or a different radio technology. A pre-distortion unit may perform gain and/or phase pre-distortion to compensate for non-linearity of the PA for each of the multiple transmitter settings. The pre-distortion unit may be implemented with look-up tables, as described above, or with other designs.

Figure 8:
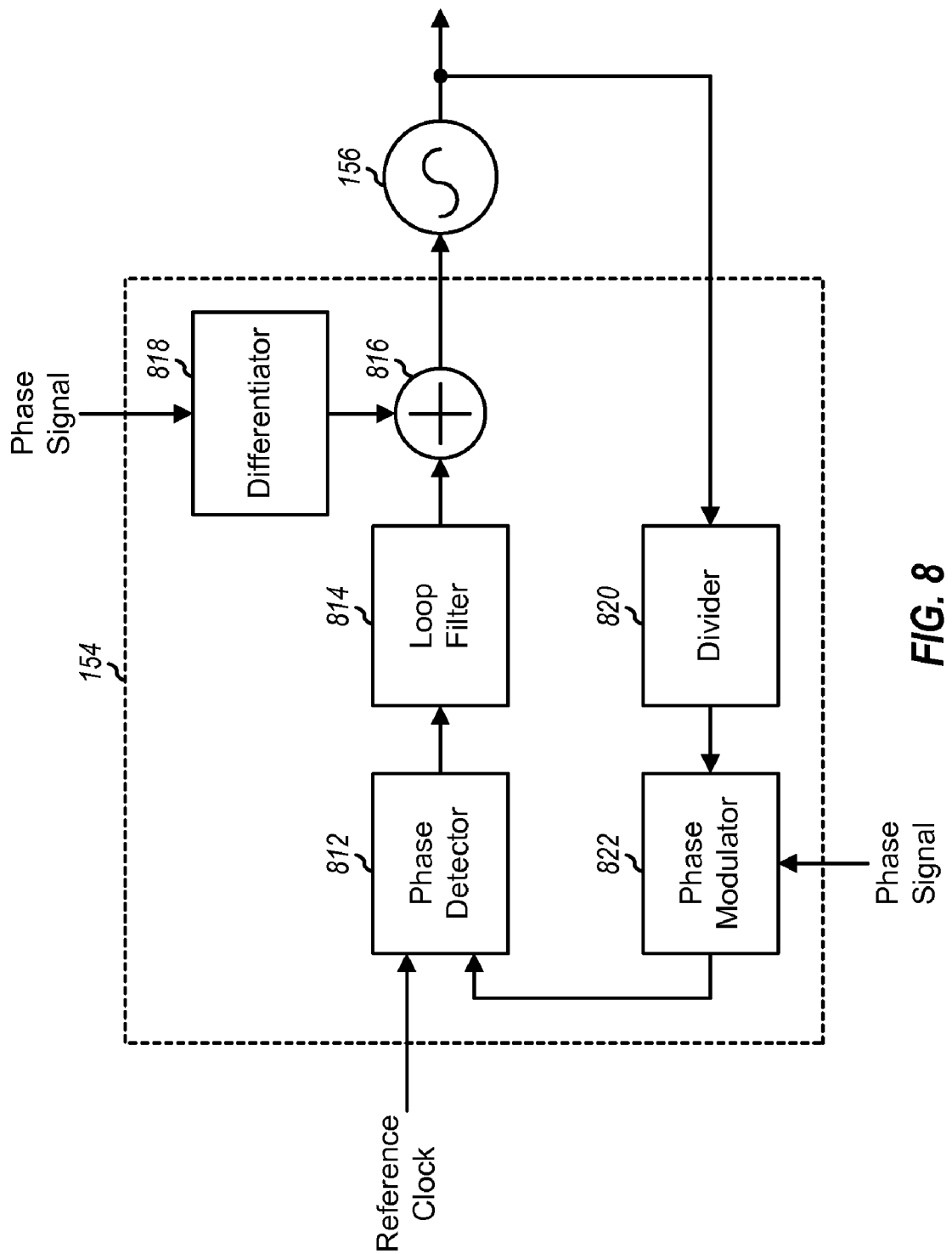
FIG. 8 shows a block diagram of a phase locked loop (PLL).

FIG. 8 shows a block diagram of a design of PLL 154 in FIGS. 1 through 5. Within PLL 154, a divider 820 receives the I or Q LO signal from VCO 156, divides the LO signal in frequency by a factor of R, and provides a divided LO signal. The divider ratio R is determined by the frequency of a desired RF channel, $f_{ch}$, and the frequency of a reference clock, $f_{ref}$, or $R=f_{ch}/f_{ref}$. The divider ratio R may or may not be an integer value and may vary over time, especially when phase modulation is performed for polar modulation. A phase modulator 822 modulates the phase of the divided LO signal with a phase signal from filter 152.

A phase detector 812 receives the reference clock and the signal from phase modulator 822, compares the phases of the two signals, and provides a detector output signal that is proportional to the detected phase difference between the two signals. A loop filter 814 filters the detector output signal with a transfer function and provides a loop filter output signal. A differentiator 818 differentiates the phase signal from filter 152. A summer 816 sums the loop filter output signal and a differentiator output signal and provides the control signal for VCO 156. The control signal adjusts the phase of VCO 156 to achieve phase modulation when polar modulation is selected.

The filters in FIGS. 1 through 5 may be implemented with various designs. These filters may also be used for various purposes. For example, the filters may pass desired signal components and reject out-of-band components such as adjacent channel leakage rejection (ACLR). The filters may also perform pre-equalizing to compensate for frequency response (e.g., droop) in various circuit blocks in the transmitters.

The transmitters described herein may be implemented in hardware, firmware, software, or a combination thereof. The circuit blocks in FIGS. 1 through 5 prior to the DACs may be implemented with hardware, firmware, and/or software. For a hardware implementation, the circuit blocks may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, a computer, or a combination thereof. For a firmware and/or software implementation, the processing by the circuit blocks prior to the DACs may be implemented with modules (e.g., procedures, functions, etc.) that perform the functions described herein. The firmware and/or software instructions may be stored in a memory (e.g., memory 112 in FIG. 1) and executed by a processor (e.g., processor 110). The analog portion after the DACs may be implemented with hardware, which may be embodied in one or more integrated circuits (ICs), RF ICs (RFICs), discrete components, etc.

The transmitters described herein may be fabricated in various IC process technologies such as complementary metal oxide semiconductor (CMOS), N-MOS, P-MOS, bipolar-CMOS (Bi-CMOS), bipolar, etc. The transmitters may be fabricated using any device size technology (e.g., 130 nanometer (nm), 65 nm, 30 nm, and so on).

An apparatus implementing a transmitter described herein may be a stand-alone unit or may be part of a device. The device may be (i) a stand-alone integrated circuit (IC), (ii) a set of one or more ICs that may include memory ICs for storing data and/or instructions, (iii) an ASIC such as a mobile station modem (MSM) and/or an RFIC, (iv) a module that may be embedded within other devices, (v) a cellular phone, wireless device, handset, or mobile unit, (vi) etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus comprising:
a transmitter configured to perform quadrature modulation based on inphase (I) and quadrature (Q) data signals when quadrature modulation is selected, to perform a first polar modulation based on the I and Q data signals when a first polar modulation mode is selected, to perform a second, different polar modulation based on the I and Q data signals when a second, different polar modulation mode is selected, to generate a modulated signal with amplitude and phase modulation, and to perform pre-distortion for each of the first polar modulation mode, the second polar modulation mode, and the quadrature modulation, the transmitter comprising at least one circuit block used for both quadrature modulation and polar modulation.

2. The apparatus of claim 1, wherein the transmitter comprises
a power amplifier (PA) configured to provide amplification for the modulated signal for both quadrature modulation and polar modulation.

3. The apparatus of claim 2, wherein the power amplifier is a linear power amplifier.

4. The apparatus of claim 2, wherein the transmitter and the power amplifier are operable in multiple frequency bands.

5. The apparatus of claim 1, wherein the transmitter comprises
a converter configured to convert the I and Q data signals from quadrature to polar and to provide an envelope signal and a phase signal, and wherein the transmitter is configured to perform polar modulation based on the envelope and phase signals when polar modulation is selected.

6. A method comprising:
performing quadrature modulation based on inphase (I) and quadrature (Q) data signals when quadrature modulation is selected;
performing a first polar modulation based on the I and Q data signals when a first polar modulation mode is selected;
performing a second, different polar modulation based on the I and Q data signals when a second, different polar modulation mode is selected;
performing pre-distortion in at least one of the first polar modulation mode and the second polar modulation mode when pre-distortion is selected;
generating a modulated signal with amplitude and phase modulation for both quadrature modulation and polar modulation; and
amplifying the modulated signal with a single power amplifier for both quadrature modulation and polar modulation.

7. An apparatus comprising:
an oscillator configured to provide inphase (I) and quadrature (Q) local oscillator (LO) signals;
a modulator configured to perform quadrature modulation on the I and Q LO signals with I and Q modulating signals when quadrature modulation is selected and to perform amplitude modulation on the I and Q LO signals with an envelope signal when either a first polar modulation mode or a second polar modulation mode is selected; and at least one pre-distortion unit to perform pre-distortion for each of the first polar modulation mode, the second polar modulation mode, and the quadrature modulation.

8. The apparatus of claim 7, wherein the oscillator is configured to provide the I and Q LO signals without phase modulation when quadrature modulation is selected and to provide at least one of the I and Q LO signals with phase modulation when polar modulation is selected.

9. The apparatus of claim 7, wherein the modulator comprises
a first mixer configured to modulate the I LO signal with the I modulating signal when quadrature modulation is selected,
a second mixer configured to modulate the Q LO signal with the Q modulating signal when quadrature modulation is selected, and
a summer configured to sum outputs of the first and second mixers when quadrature modulation is selected and to provide a modulated signal.

10. The apparatus of claim 9, wherein at least one of the first and second mixers is configured to modulate at least one of the I and Q LO signals with the envelope signal when polar modulation is selected.

11. The apparatus of claim 7, further comprising:
a power amplifier (PA) configured to amplify a modulated signal from the modulator.

12. An apparatus comprising:
a power amplifier configured to provide amplification for multiple transmitter settings, each transmitter setting corresponding to a different frequency band or a different radio technology;
a pre-distortion unit configured to perform pre-distortion to compensate for non-linearity of the power amplifier for each of the multiple transmitter settings, the pre-distortion unit comprising:
an envelope distortion unit configured to receive an input envelope signal and provide a pre-distorted envelope signal; and
a phase distortion unit configured to receive the pre-distorted envelope signal and provide a phase correction signal; and
at least one multiplexer coupled to the pre-distortion unit for providing a pre-distorted signal when pre-distortion is applied.

13. The apparatus of claim 12, wherein the pre-distortion unit is configured to perform pre-distortion on envelope and phase signals and to provide pre-distorted envelope and phase signals for each transmitter setting, and wherein the power amplifier is configured to provide amplification for a modulated signal generated based on the pre-distorted envelope and phase signals.

14. The apparatus of claim 12, wherein the pre-distortion unit further comprises
a multiplier configured to scale an envelope signal with a gain and to provide the input envelope signal to the envelope distortion unit, wherein the gain is selected such that signal level provided to the envelope distortion unit matches signal level provided to the power amplifier.

15. The apparatus of claim 12, wherein the pre-distortion unit further comprises a summer configured to sum a phase signal with the phase correction signal to obtain a pre-distorted phase signal.

16. The apparatus of claim 12, further comprising:
a converter configured to convert inphase (I) and quadrature (Q) data signals from quadrature to polar and to provide an envelope signal and a phase signal, wherein the pre-distortion unit is configured to perform pre-distortion on the envelope and phase signals and to provide pre-distorted envelope and phase signals; and
a rotator configured to convert the pre-distorted envelope and phase signals to pre-distorted I and Q signals.

17. The apparatus of claim 12, wherein the pre-distortion unit comprises
a first look-up table configured to store pre-distorted envelope values for each of the multiple transmitter settings.

18. The apparatus of claim 17, wherein the pre-distortion unit further comprises
a second look-up table configured to store phase correction values for each of the multiple transmitter settings.

19. The apparatus of claim 12, wherein the pre-distortion unit comprises
a look-up table configured to store a set of values for piece-wise linear approximation of a correction function for each of the multiple transmitter settings.

20. The apparatus of claim 19, wherein the pre-distortion unit is configured to perform linear interpolation for the piece-wise linear approximation of the correction function for each transmitter setting.

21. An apparatus comprising:
a transmitter configured to generate a phase modulated signal when either a first polar modulation mode or a second polar modulation mode is selected and to generate a quadrature modulated signal when quadrature modulation is selected, the transmitter comprising
a linear power amplifier configured to provide amplification for the quadrature modulated signal when quadrature modulation is selected;
a non-linear power amplifier configured to provide amplification and amplitude modulation for the phase modulated signal when either the first polar modulation mode or the second polar modulation mode is selected; and
an oscillator configured to provide the phase modulated signal when the first polar modulation mode is selected, provide the phase modulated signal when the second polar modulation mode is selected, and to provide inphase (I) and quadrature (Q) local oscillator (LO) signals when quadrature modulation is selected.

22. The apparatus of claim 21, wherein the transmitter further comprises
a modulator configured to perform quadrature modulation on inphase (I) and quadrature (Q) local oscillator (LO) signals with I and Q modulating signals and to provide the quadrature modulated signal when quadrature modulation is selected.

23. The apparatus of claim 21, wherein the transmitter is configured to generate the phase modulated signal when large amplitude polar modulation is selected and to generate a phase and amplitude modulated signal when small amplitude polar modulation is selected, wherein the linear power amplifier is configured to provide amplification for the phase and amplitude modulated signal when small amplitude polar modulation is selected, and wherein the non-linear power amplifier is configured to provide amplification and amplitude modulation for the phase modulated signal when large amplitude polar modulation is selected.

* * * * *